United States Patent
Nishiura (10) Patent No.: US 9,081,054 B2
(45) Date of Patent: Jul. 14, 2015

(54) BOARD ASSEMBLY, ELECTRONIC DEVICE TEST APPARATUS AND WATER JACKET

(75) Inventor: Koei Nishiura, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 518 days.

(21) Appl. No.: 13/523,126

(22) Filed: Jun. 14, 2012

(65) Prior Publication Data

US 2012/0320527 A1 Dec. 20, 2012

(30) Foreign Application Priority Data

Jun. 16, 2011 (JP) ................................. 2011-134179

(51) Int. Cl.
*H05K 7/20* (2006.01)
*G01R 31/28* (2006.01)

(52) U.S. Cl.
CPC ........ *G01R 31/2863* (2013.01); *H05K 7/20218* (2013.01); *G01R 31/2877* (2013.01); *H05K 7/20509* (2013.01)

(58) Field of Classification Search
CPC ....................... H05K 7/20254; H05K 7/20509
USPC .......................................................... 361/711
See application file for complete search history.

(56) References Cited

U.S. PATENT DOCUMENTS

| 4,884,168 | A | * | 11/1989 | August et al. ................. 361/702 |
| 5,245,508 | A | * | 9/1993 | Mizzi ............................. 361/694 |
| 5,761,043 | A | * | 6/1998 | Salmonson .................... 361/707 |
| 7,009,842 | B2 | | 3/2006 | Tilton et al. |
| 7,301,772 | B2 | | 11/2007 | Tilton et al. |
| 7,345,877 | B2 | * | 3/2008 | Asfia et al. .................... 361/700 |
| 7,764,498 | B2 | * | 7/2010 | Conn .............................. 361/699 |
| 2005/0168949 | A1 | | 8/2005 | Tilton et al. |
| 2006/0126295 | A1 | | 6/2006 | Tilton et al. |
| 2008/0158818 | A1 | | 7/2008 | Clidaras et al. |
| 2010/0271779 | A1 | | 10/2010 | Nishiura |
| 2012/0119752 | A1 | | 5/2012 | Ataka et al. |

FOREIGN PATENT DOCUMENTS

| CN | 201138905 | 10/2008 |
| JP | 2001-168566 | 6/2001 |
| JP | 2007-520089 | 7/2007 |
| JP | 2007-258458 | 10/2007 |
| WO | 2010/050132 | 5/2010 |

OTHER PUBLICATIONS

China Office action, dated Sep. 2, 2014 along with an English translation thereof.
Taiwan Office action, dated Oct. 16, 2014.

* cited by examiner

*Primary Examiner* — Gregory Thompson
(74) *Attorney, Agent, or Firm* — Greenblum & Bernstein, P.L.C.

(57) ABSTRACT

A board assembly which enables reduction of the size of an electronic device test apparatus is provided. A test module 20 comprises: a first pin electronics card 21; a second pin electronics card 22; and a single intermediate water jacket 23 which is sandwiched between the first pin electronics card 21 and second pin electronics card 22. The intermediate water jacket 23 is in close contact with the first inside main surface 212 of the first pin electronics card 21 which faces the second pin electronics card 22 and is in close contact with the second inside main surface 222 of the second pin electronics card 22 which faces the first pin electronics card 21.

14 Claims, 13 Drawing Sheets

BOARD ASSEMBLY, ELECTRONIC DEVICE TEST APPARATUS AND WATER JACKET

TECHNICAL FIELD

The present invention relates to a board assembly which comprises a water jacket for cooling an electronic device which is mounted on a board, an electronic device test apparatus which comprises the board assembly, and a water jacket which can be used for the board assembly.

The present application claims priority from Japanese Patent Application No. 2011-134179 filed on Jun. 16, 2011. The contents described and/or illustrated in the documents relevant to the Japanese Patent Application No. 2011-134179 will be incorporated herein by reference as a part of the description and/or drawings of the present application.

BACKGROUND ART

The test head of an electronic device test apparatus for testing semiconductor integrated circuit devices and other devices under test (DUT) contains pin electronic cards to which large numbers of various test-use devices which form high frequency circuits or power circuits for test use are mounted.

Among such test-use devices, there are ones which become high in temperature due to self generated heat. Therefore, the art of supplying a coolant to a water jacket which is attached to the pin electronics cards so as to cool the test-use devices has been known since the past (for example, see PLT 1).

CITATIONS LIST

Patent Literature

PLT 1. Japanese Patent Publication (A) No. 2001-168566

SUMMARY OF INVENTION

Technical Problem

However, in the above art, a single pin electronics card is sandwiched between two water jackets and a plurality of such pin electronics cards are held inside the test head. Therefore, there is the problem that increased size of the test head is invited.

The problem to be solved by the present invention is to provide a board assembly, electronic device test apparatus, and water jacket which enable reduction of size of the electronic device test apparatus.

Solution to Problem

[1] A board assembly according to the present invention is a board comprising: a first board; a second board; and one intermediate water jacket which is sandwiched between the first board and the second board, wherein the intermediate water jacket is in close contact with a first inside main surface of the first board which faces the second board and is in close contact with a second inside main surface of the second board which faces the first board.

[2] Further, a board assembly according to the present invention is a board comprising: a first board; a second board; and an intermediate water jacket which is sandwiched between the first board and the second board, wherein the first board has at least one first electronic device which is mounted on a first inside main surface of the first board which faces the second board, the second board has at least one second electronic device which is mounted on a second inside main surface of the second board which faces the first board, the intermediate water jacket has: a first passage through which a coolant can run and opens toward the first inside main surface; and a second passage through which a coolant can run and opens toward the second inside main surface, the first electronic device is housed in the first passage, and the second electronic device is housed in the second passage.

[3] In the above invention, the first passage and the second passage may be the same passage.

[4] In the above invention, the first passage and the second passage may be mutually independent.

[5] In the above invention, the first board may have a first connector which is mounted on the first inside main surface, and the second board may have a second connector which is mounted on the second inside main surface.

[6] In the above invention, in a plan view, the first connector and the second connector may be arranged to be mutually offset.

[7] In the above invention, the assembly may comprise a spacer which is interposed between the first board and the second board, and the spacer may have a guide pin which sticks out toward the engagement direction of the first and the second connectors.

[8] In the above invention, the assembly may comprise: a first outside water jacket which is attached to a first outside main surface of the first board at an opposite side to the first inside main surface; and a second outside water jacket which is attached to a second outside main surface of the second board at an opposite side to the second inside main surface, the first outside water jacket and the first board may be fastened by a first bolt to the intermediate water jacket, and the second outside water jacket and the second board may be fastened by a second bolt to the intermediate water jacket.

[9] In the above invention, in a plan view, the first bolt and the second bolt may be arranged to be mutually offset.

[10] Further, the electronic device test apparatus according to the present invention is characterized by comprising a test head inside of which the board assembly is housed.

[11] Further, the water jacket according to the present invention is a water jacket which is attached to a board so as cool an electronic devices which is mounted on the board by using a coolant, the water jacket comprising: a first passage through which the coolant can run and which opens to one main surface; and a second passage through which the coolant can run and which opens to another main surface.

[12] In the above invention, the first passage and the second passage may also be the same passage.

[13] In the above invention, the first passage and the second passage may be mutually independent.

Advantageous Effects of Invention

In the present invention, by sandwiching a single water jacket between the first board and the second board, it is possible to have two boards share a single water jacket, so the electronic device test apparatus can be made smaller in size.

Further, in the present invention, the two surfaces of the water jacket have passages opened in them, so it is possible to have two boards share a single water jacket and possible to reduce the size of the electronic device test apparatus.

DESCRIPTION OF EMBODIMENTS

Below, embodiments of the present invention will be explained based on the drawings.

Figure 1:
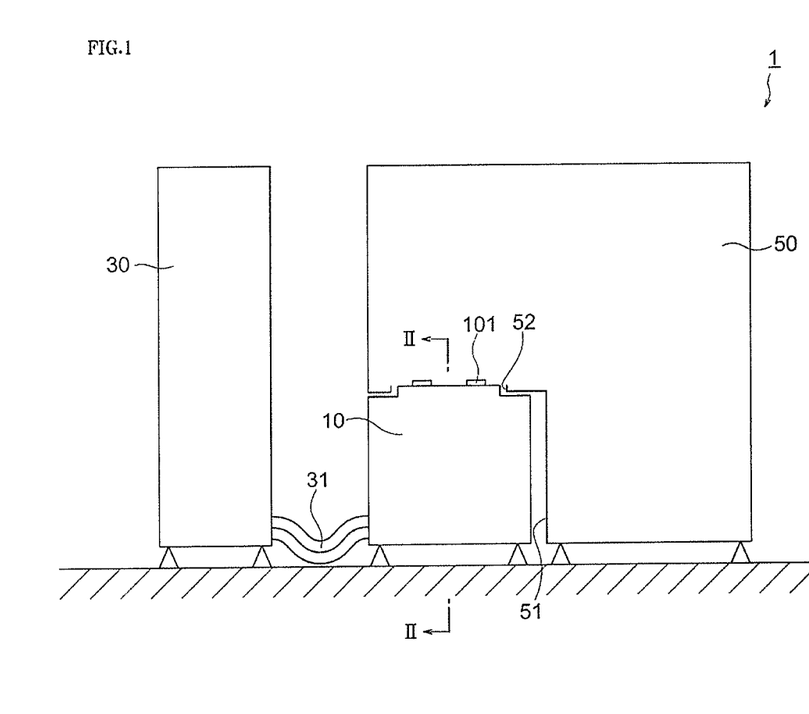
FIG. 1 is a cross-sectional view which shows an electronic device test apparatus in an embodiment of the present invention.
Figure 2:
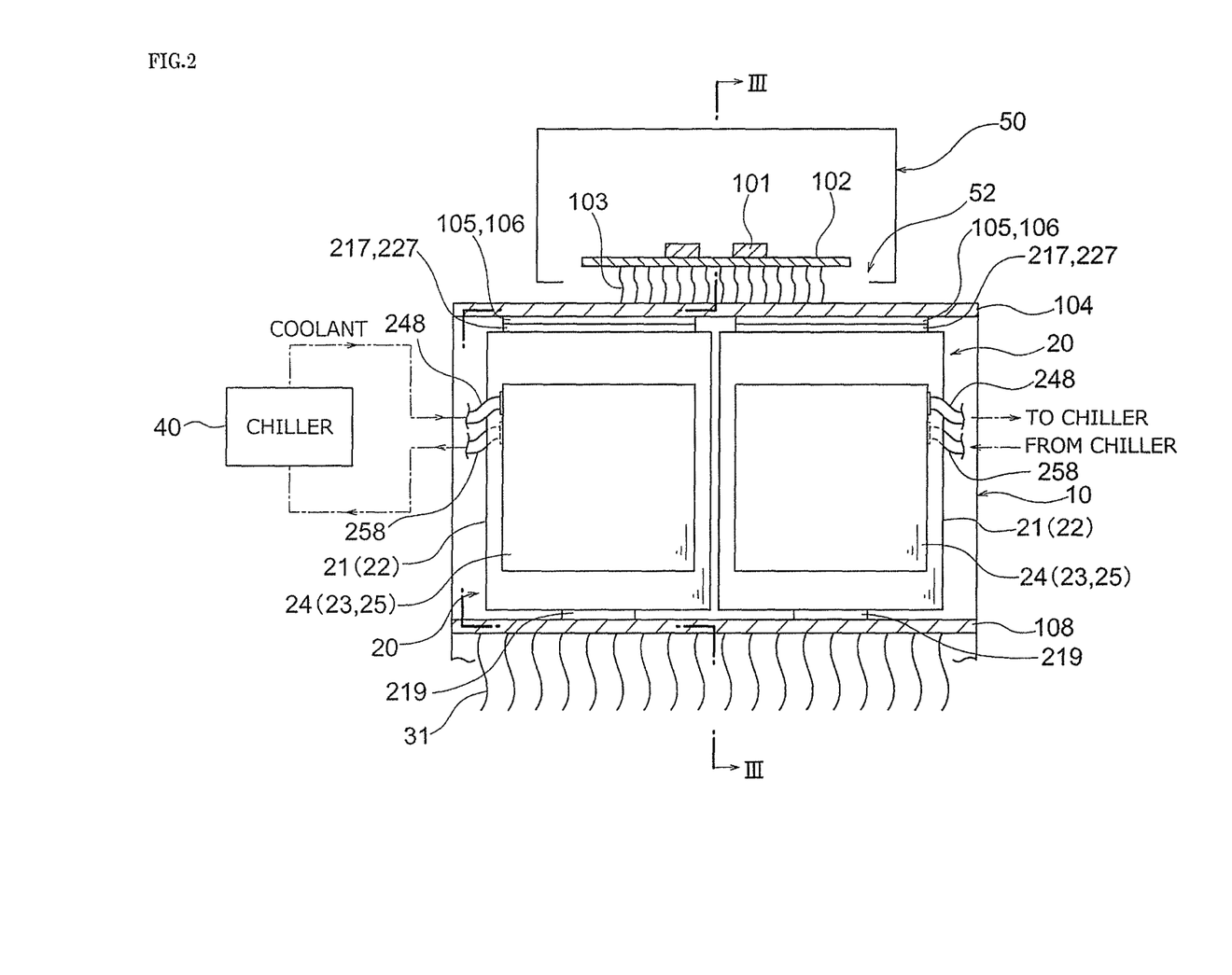
FIG. 2 is a cross-sectional view of a test head along the line II-II of FIG. 1.
Figure 3:
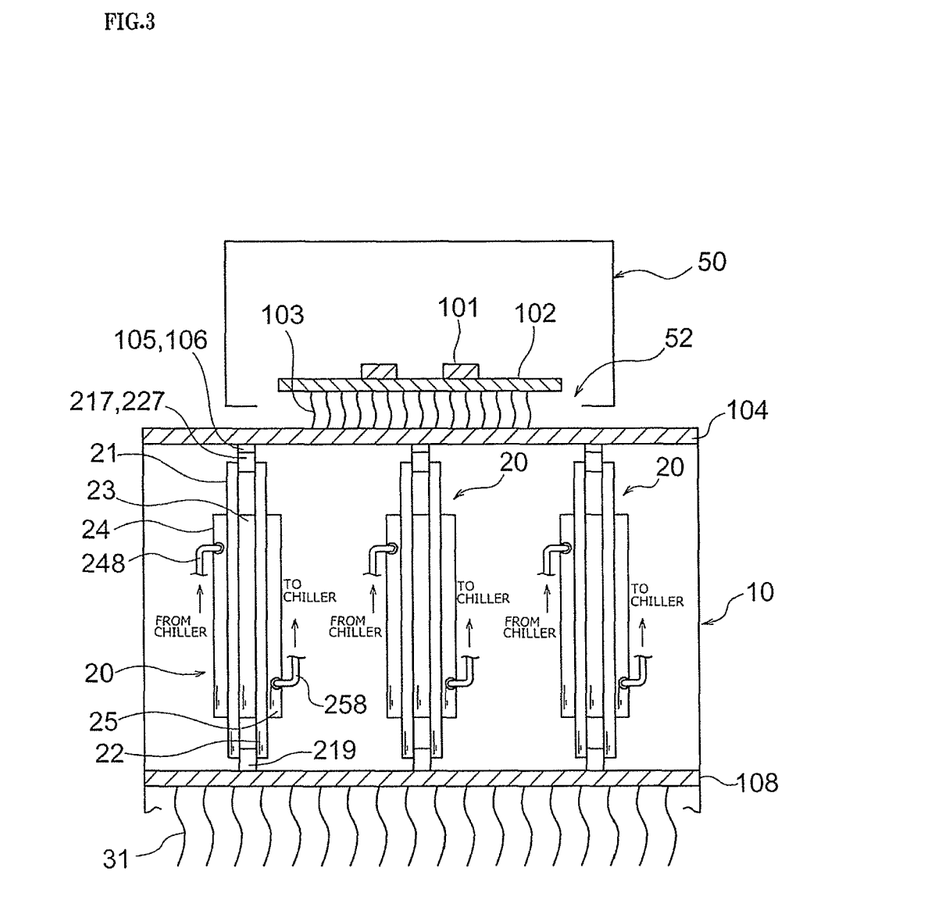
FIG. 3 is a cross-sectional view of a test head along the line III-III of FIG. 2.

FIG. 1 is a cross-sectional view which shows an electronic device test apparatus in the present embodiment, FIG. 2 is a cross-sectional view of a test head along the line II-II of FIG. 1, and FIG. 3 is a cross-sectional view of a test head along the line III-III of FIG. 2.

The electronic device test apparatus 1 in the present embodiment, as shown in FIG. 1, comprises: a test head 10 which is electrically connected to devices under test (DUT); and a control device which is connected to the test head 10 through a cable 1.

The test head 10 is arranged interchangeably in a space 51 which is formed at the bottom of the handler 50. Sockets 101 to which the DUT's are connected at the time of a test are provided at the top part of this test head 10. The sockets 101 enter inside a handler 50 through an opening 52 which is formed in the handler 50. The handler 50 successively conveys DUT's to the test head 10 where the DUT's are pushed into the sockets 101. The electronic device test apparatus 1 runs tests on the DUT's in this state. Incidentally, the tested DUT's are classified by the handler 50 in accordance with the test results.

The handler 50 can apply high temperature or low temperature thermal stress to the DUT's. The electronic device test apparatus 1 runs tests on the DUT's in the state with thermal stress applied to the DUT's (or in an ordinary temperature state). As the handler 50, for example, a heat plate type or chamber type or other known handler can be used. Note that, in the present embodiment, the test head 10 is attached to the handler 50 from the bottom, but the direction in which the test head is attached to the handler is not particularly limited. For example, the test head can also be attached to the handler from the side or the test head can be attached to the handler from above.

The sockets 101 have large numbers of contact pins (not shown) which electrically contact terminals of the DUT's. As shown in FIG. 2 and FIG. 3, they are mounted on a socket board 102. Further, this socket board 102 is electrically connected to a mother board 104 through a cable 103 etc. In the present embodiment, for example, four sockets 101 are arranged on the test head 10 in two columns and two rows, but the number of sockets is not particularly limited.

Inside of the test head 10, test modules 20 which test the DUT's are held. The test modules 20 are electrically connected through connectors 217, 105 (227, 106) to the above-mentioned mother board 104. The test modules 20 trade test signals with the DUT's through the sockets 101 and the mother board 104 so as to test the DUT's.

Further, the test modules 20 are electrically connected through lower connectors 219 to a back board 108 which is provided at the bottom part of the test head 10. This back board 108 is connected through the cable 31 to a control device 30.

The control device 30 is, for example, a computer which runs a program so as to control the electronic device test apparatus 1 as a whole. This control device 30 communicates with the respective test modules 20 inside of the test head 10 in accordance with a program so as to control the respective test modules 20.

Below, the configuration of a test module 20 will be explained in detail while referring to FIG. 4 to FIG. 13.

Figure 4:
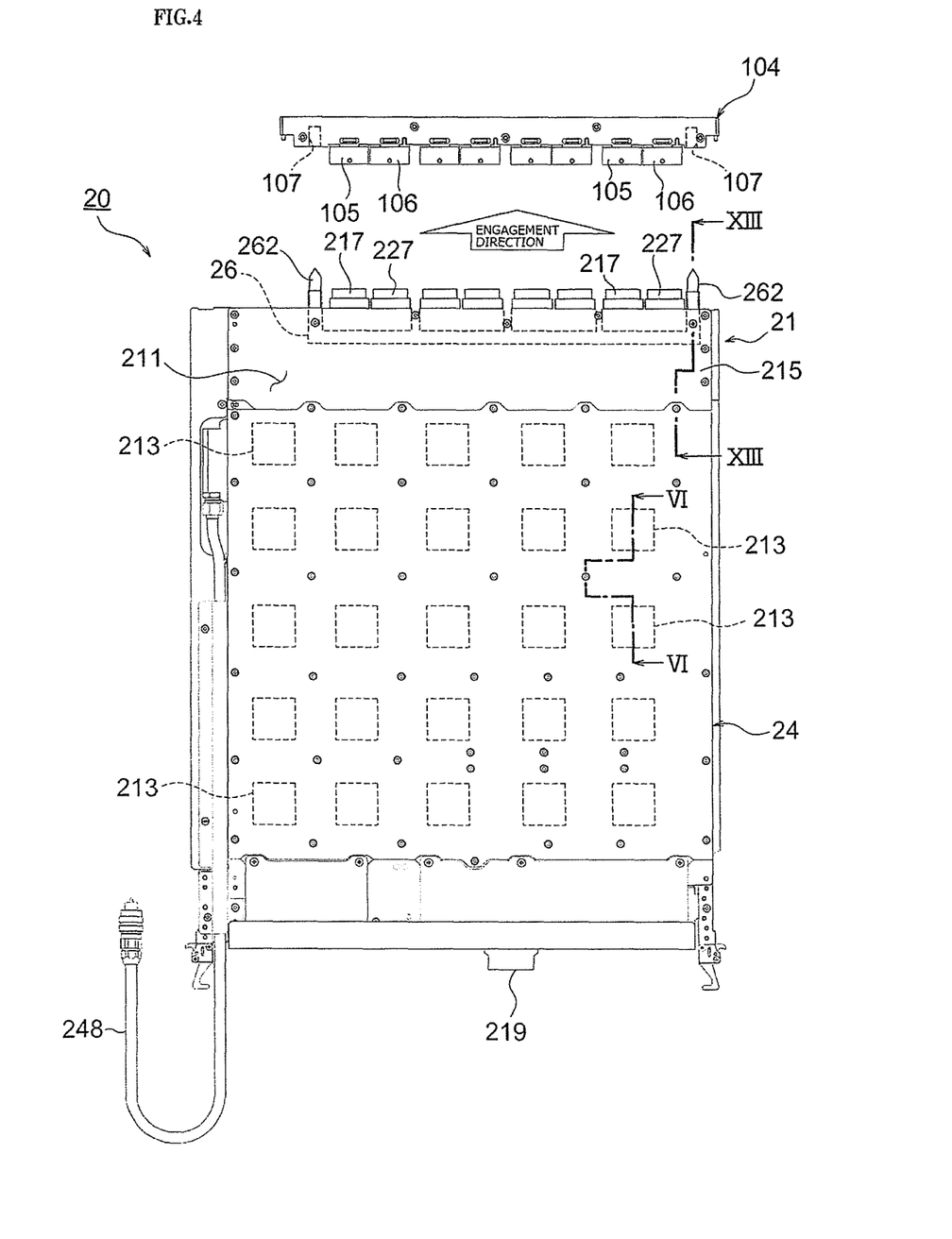
FIG. 4 is a plan view which shows a test module in an embodiment of the present invention.
Figure 5:
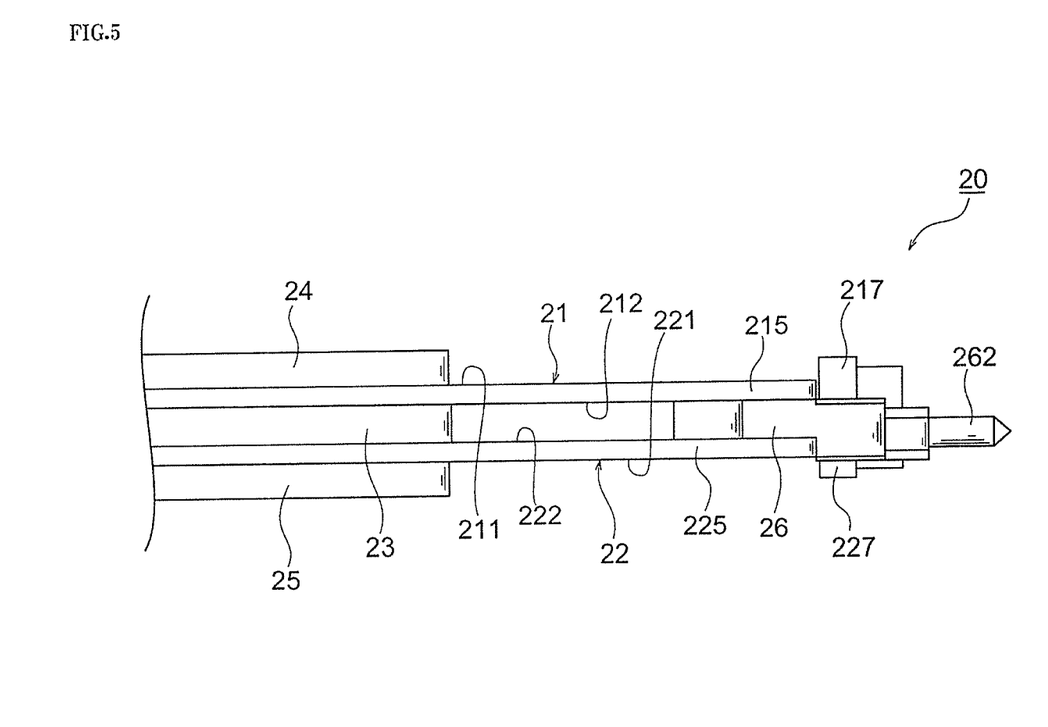
FIG. 5 is a side view of the top part of the test module which is shown in FIG. 4.
Figure 6:
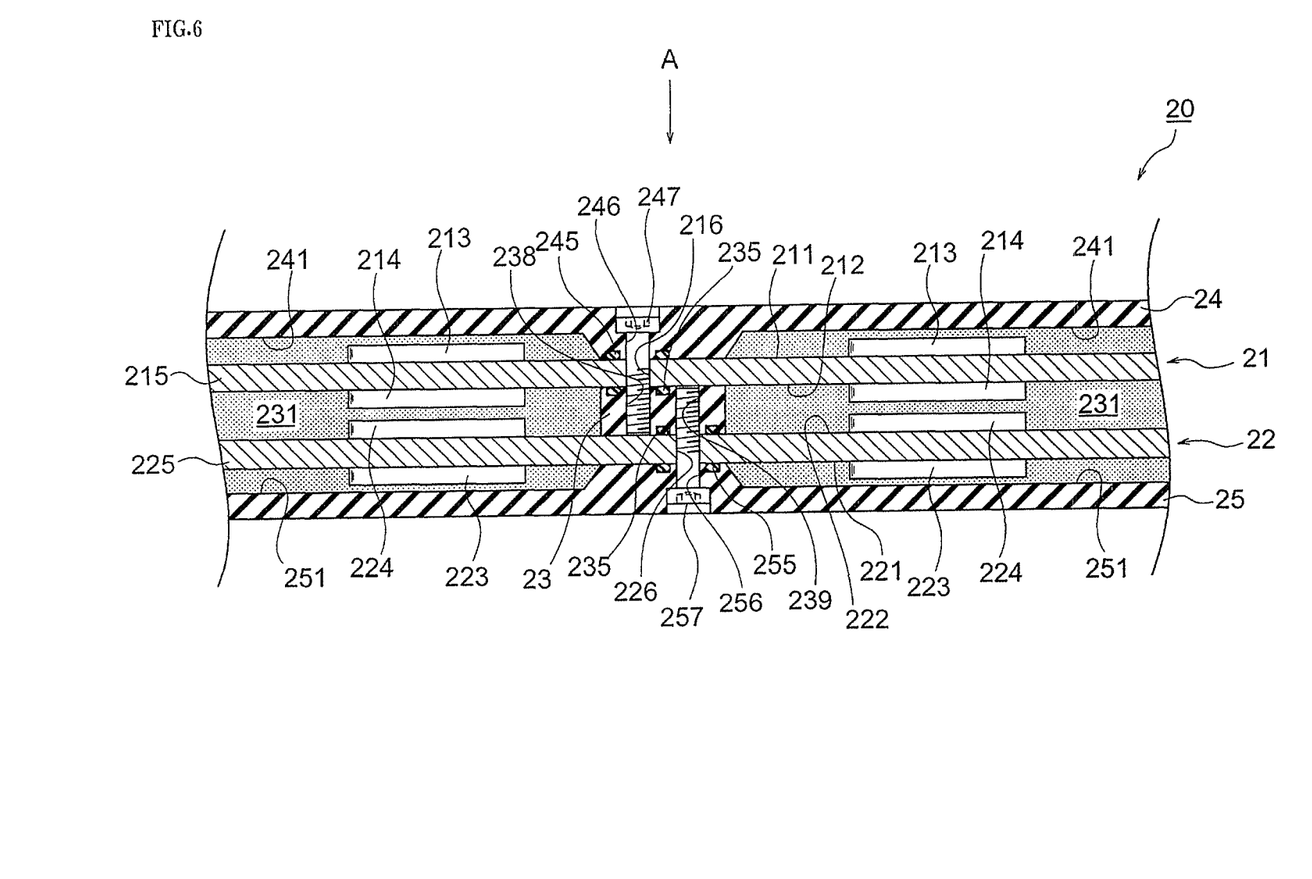
FIG. 6 is a cross-sectional view along the line VI-VI of FIG. 4.
Figure 7:
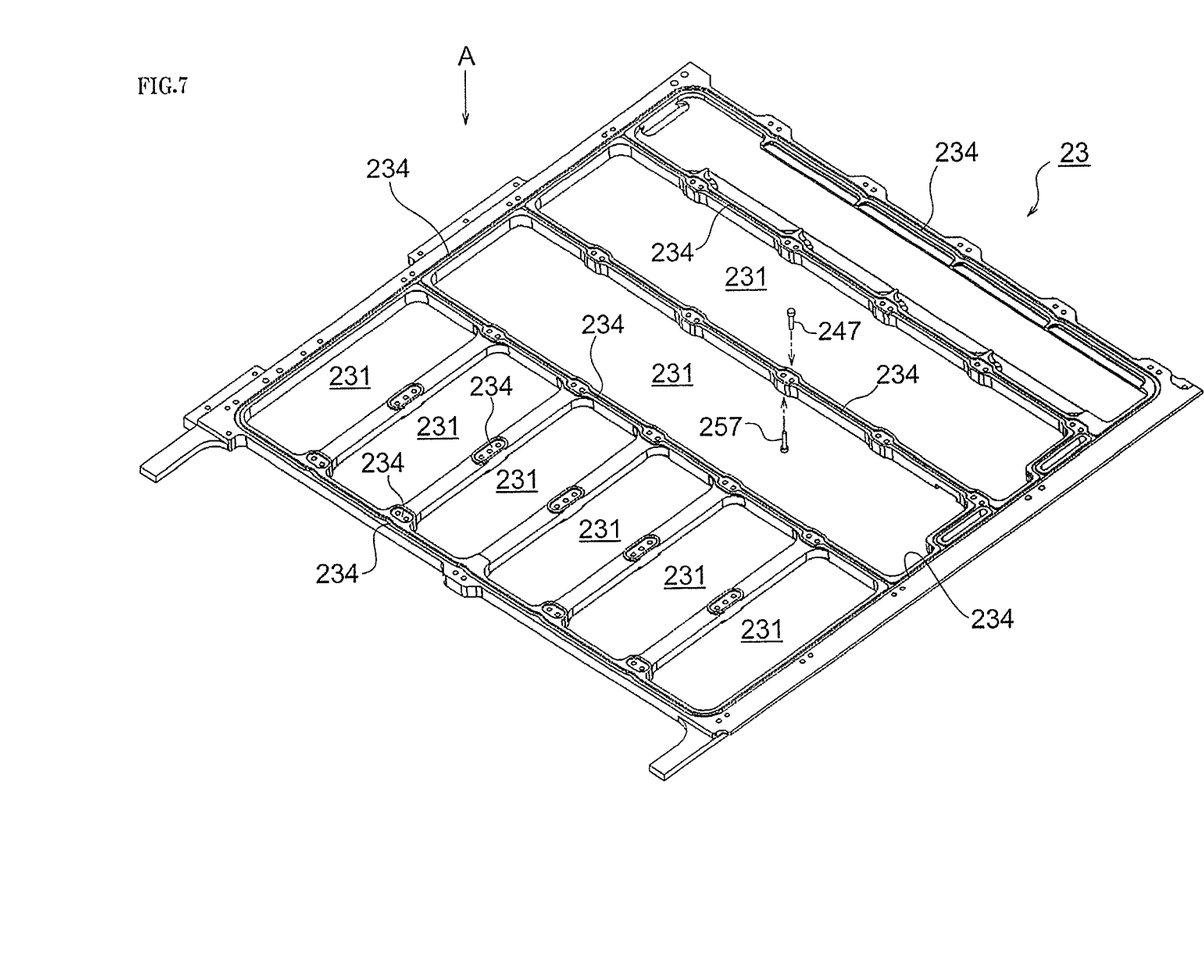
FIG. 7 is a perspective view of an intermediate water jacket in an embodiment of the present invention.
Figure 8:
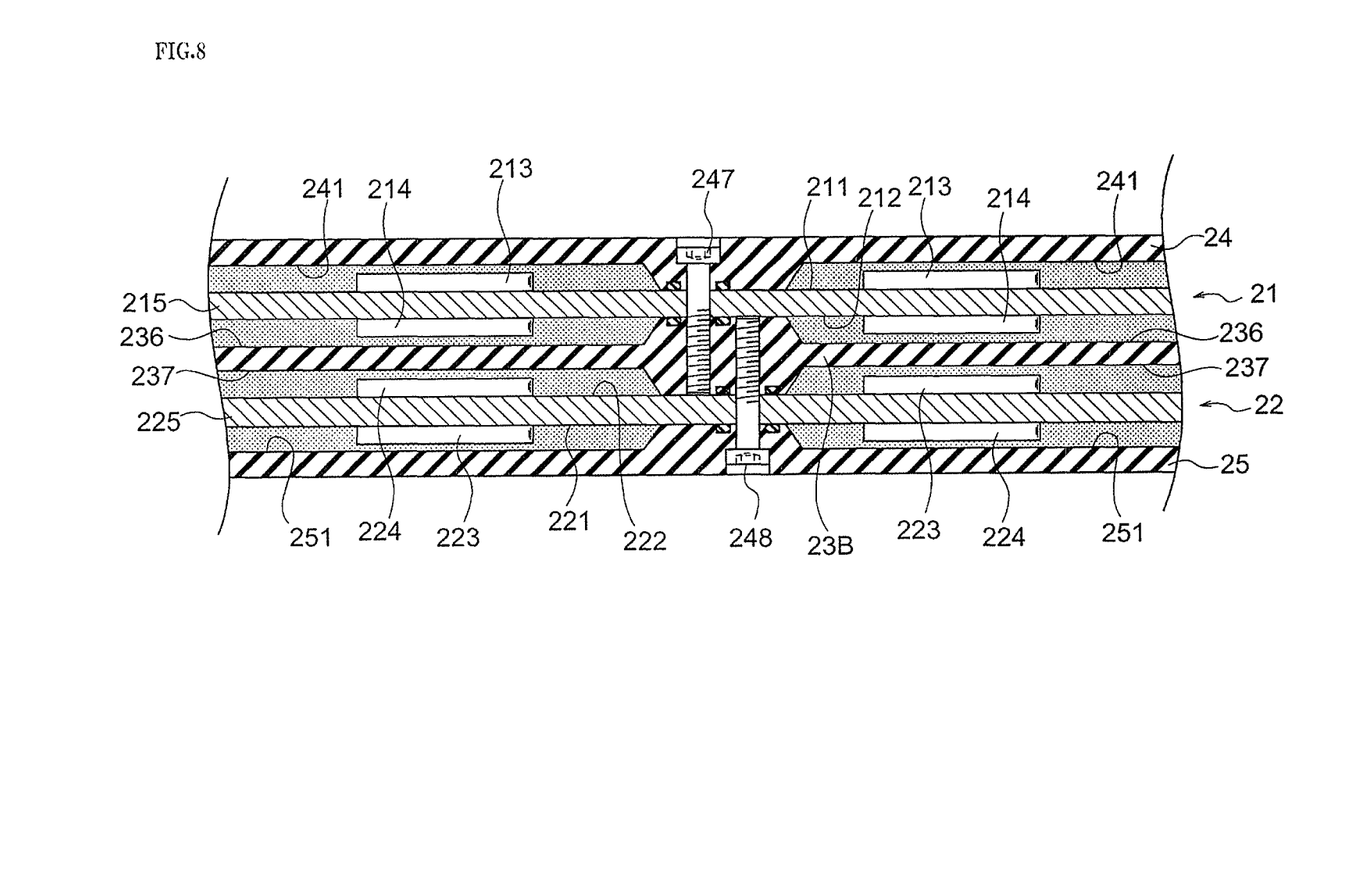
FIG. 8 is a cross-sectional view of a test module in another embodiment of the present invention.
Figure 9:
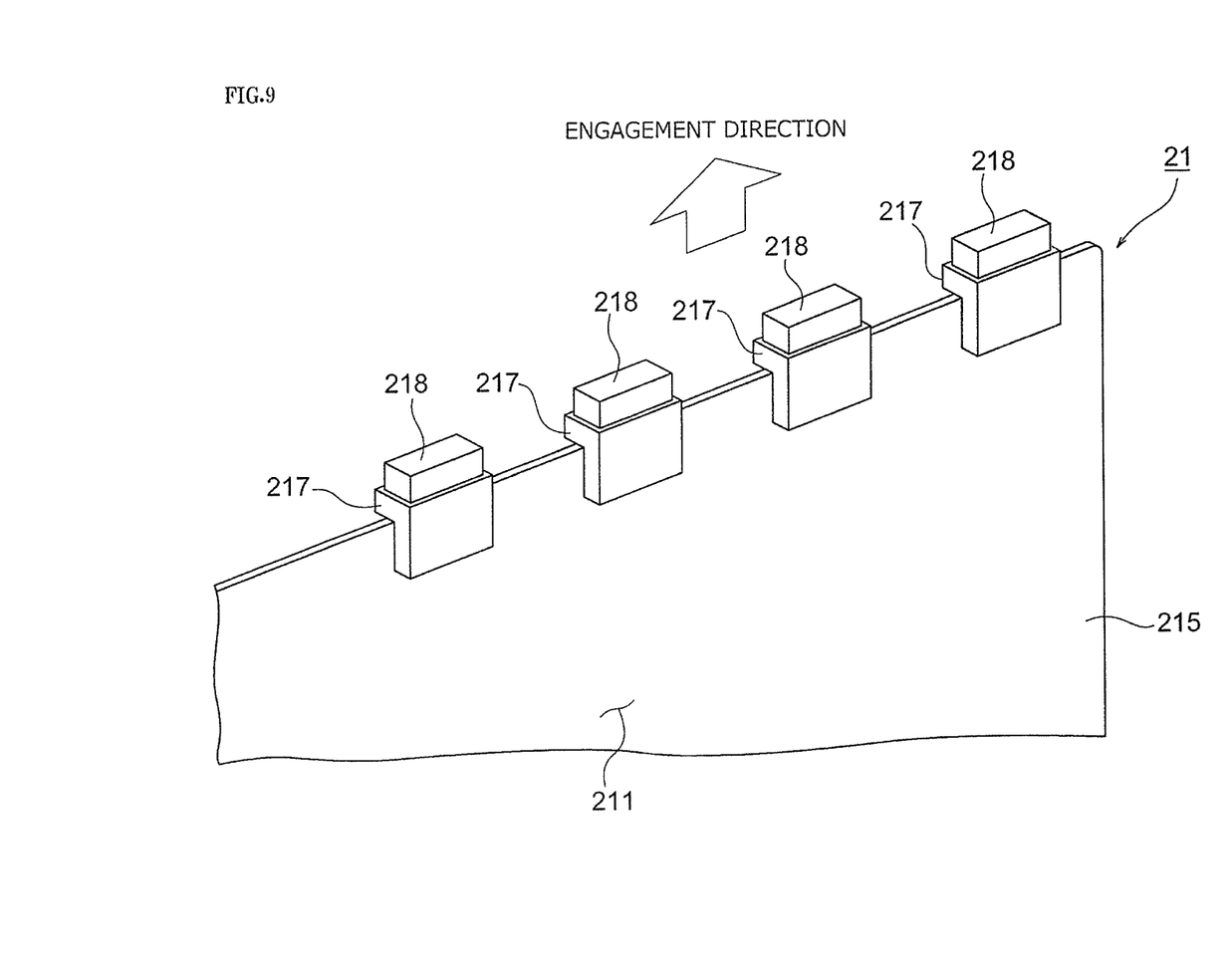
FIG. 9 is a perspective view which shows a top part of the first pin electronics card in an embodiment of the present invention.
Figure 10:
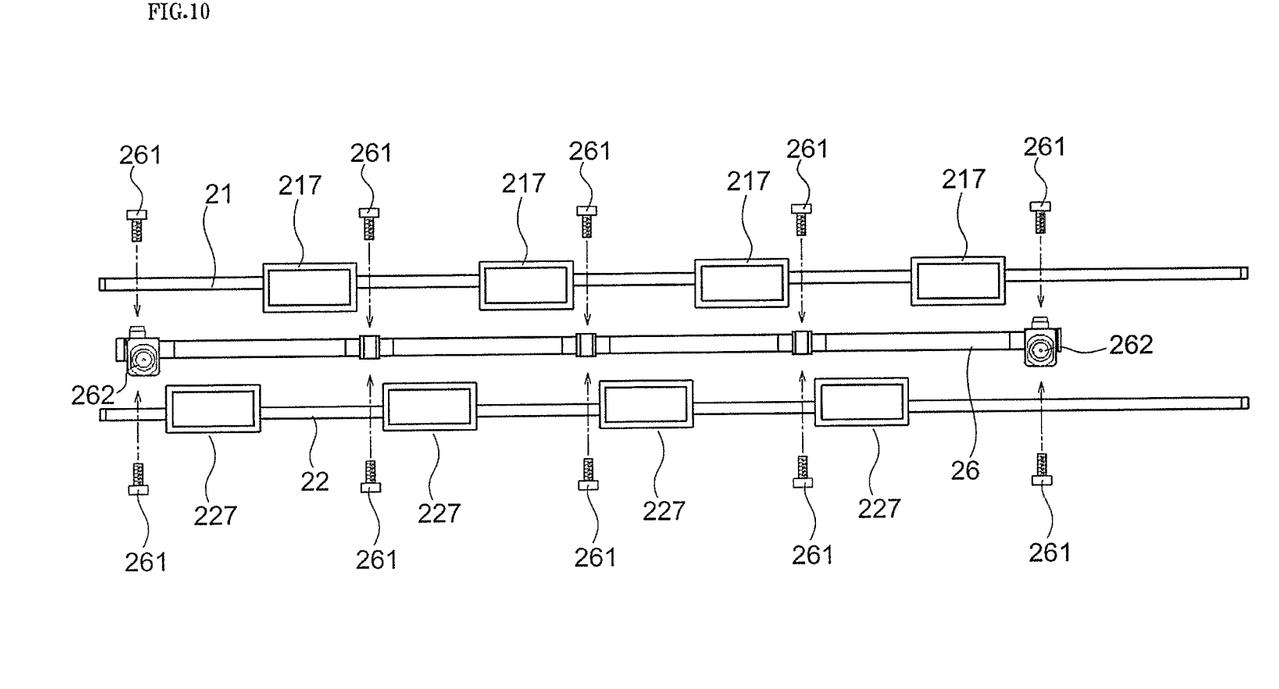
FIG. 10 is a disassembled view of the first and second pin electronics card and spacer seen from above in an embodiment of the present invention.
Figure 11:
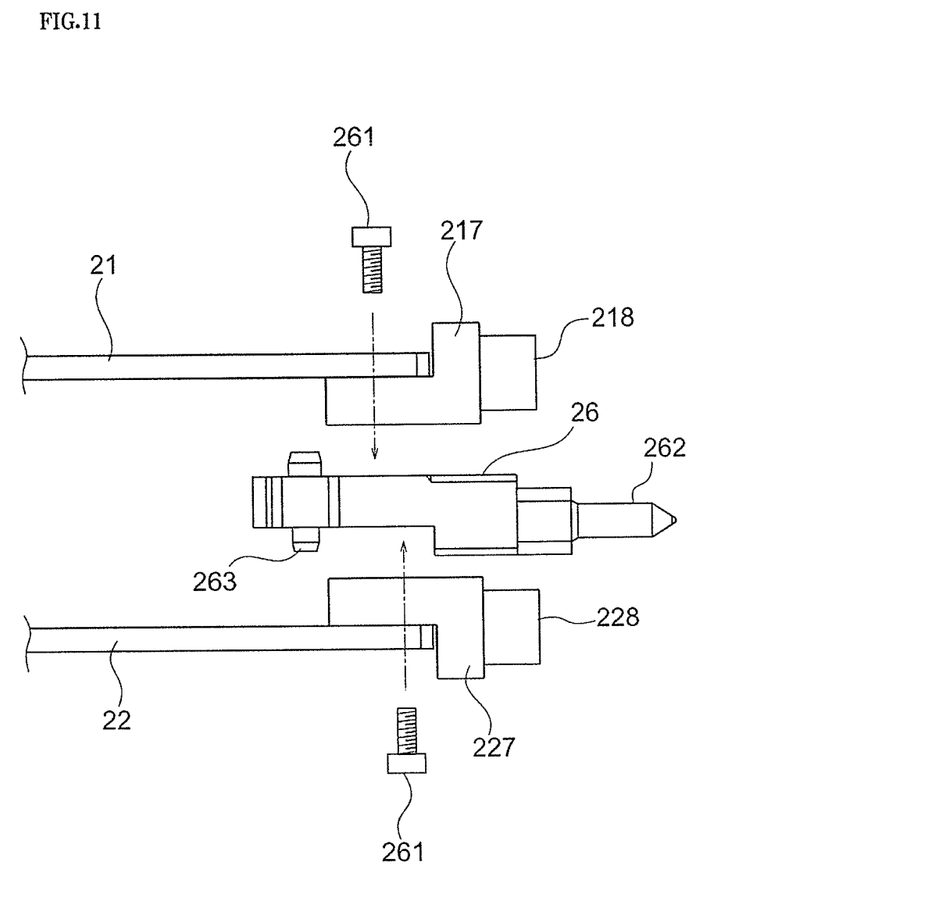
FIG. 11 is a disassembled view of the first and second pin electronics card and spacer seen from side in an embodiment of the present invention.
Figure 12:
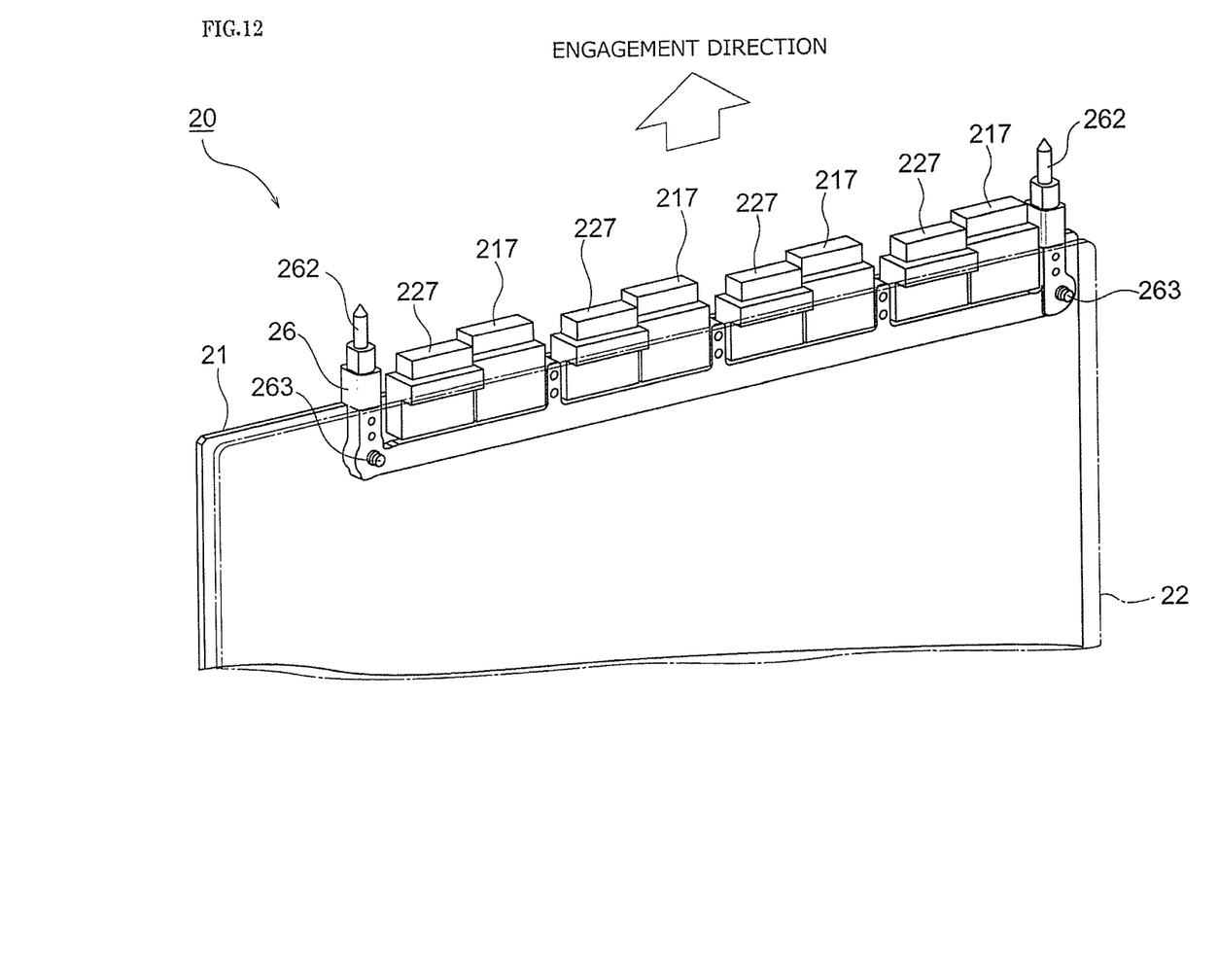
FIG. 12 is a perspective view which shows a top part of the test module in the present embodiment and a view which shows the structure through the second pin electronics card.
Figure 13:
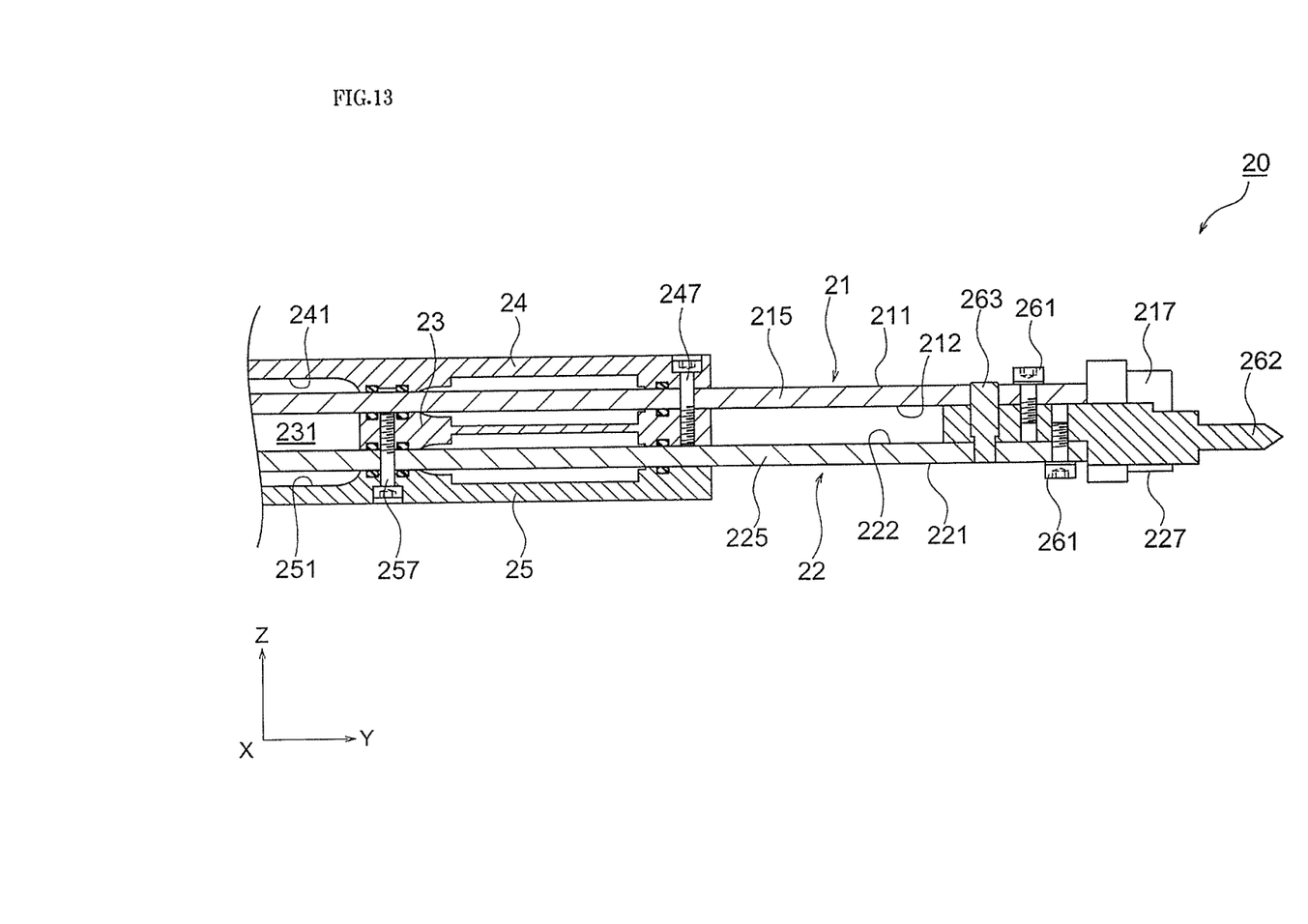
FIG. 13 is a cross-sectional view along the line XIII-XIII of FIG. 4.

FIG. 4 is a plan view which shows a test module in the present embodiment, FIG. 5 is a side view of the top part of the test module, FIG. 6 is a cross-sectional view along the line VI-VI of FIG. 4, FIG. 7 is a perspective view of an intermediate water jacket in the present embodiment, FIG. 8 is a cross-sectional view of a test module in another embodiment, FIG. 9 is a perspective view which shows a top part of a first pin electronics card in the present embodiment, FIG. 10 and FIG. 11 are disassembled views of first and second pin electronics cards and a spacer in the present embodiment, FIG. 12 is a perspective view which shows a top part of the pin electronics card in the present embodiment, and FIG. 13 is a cross-sectional view along the line XIII-XIII of FIG. 4.

The test module 20 in the present embodiment, as shown in FIG. 2 to FIG. 6, comprises two pin electronics cards 21, 22 and three water jackets 23 to 25.

In this test module 20, the so-called "liquid immersion cooling system" is employed. A coolant is circulated through the water jackets 23 to 25, and the test-use devices which are mounted on the pin electronics cards 21, 22 are directly immersed in the coolant so as to cool the test-use devices.

Note that, in the present embodiment, as shown in FIG. 3, three of these test modules 20 are contained, but the number of test modules 20 which are held inside of the test head 10 is not particularly limited.

The first pin electronics card 21, as shown in FIG. 6, comprises: first test-use devices 213, 214 which are used for testing the DUT's; and a first base member 215 which has the two surfaces on which the first test-use devices 213, 214 are mounted.

As specific examples of the first test-use devices 213, 214, for example, high frequency circuits in which LSI's etc. are built so as to handle test signals, power circuits in which switching regulators etc. are built so as to supply test-use power to the DUT's, etc. may be mentioned.

As shown in FIG. 6, the first test-use devices 213 are mounted on the outside main surface (first outside main surface 211) of the first pin electronics card 21, while the first test-use devices 214 are mounted on the inside main surface (first inside main surface 212) of the first pin electronics card 21. Note that, the number and arrangement of the first test-use devices 213 which are mounted on the first outside main surface 211 are not particularly limited. Similarly, the number and arrangement of the first test-use devices 214 which are mounted on the first inside main surface 211 are not particularly limited.

As a specific example of the first base member 215, for example, a board which is composed of a glass epoxy resin, glass, ceramic, etc. and which has electrical insulation ability may be mentioned.

The second pin electronics card 22, like the first pin electronics card 21, as shown in FIG. 6, comprises: second test-use devices 223, 224 which are used for testing the DUT's; and a second base member 225 which has the two surfaces on which the second test-use devices 223, 224 are mounted.

As specific examples of the second test-use devices 223, 224, like with the above-mentioned first test-use devices 213, 214, high frequency circuits or power circuits etc. may be mentioned.

The second test-use devices 223 are mounted at the outside main surface of the second pin electronics card 22 (second outside main surface 221), while the second test-use devices 224 are mounted on the inside main surface of the second pin electronics card 22 (second inside main surface 222). Note that, the number and arrangement of the second test-use devices 233 which are mounted on the second outside main surface 221 are not particularly limited. Similarly, the number and arrangement of the second test-use devices 224 which are mounted on the second inside main surface 222 are not particularly limited.

As a specific example of the second base member 235, like the first base member 215, for example, a board which is composed of a glass epoxy resin, glass, ceramic, etc. and which has electrical insulation ability may be mentioned.

As shown in FIG. 3, FIG. 5, and FIG. 6, an intermediate (center) water jacket 23 is sandwiched (interposed) between the two pin electronics cards 21, 22. This intermediate water jacket 23 is attached to the first inside main surface 212 of the first pin electronics card 21 and is attached to the second inside main surface 222 of the second pin electronics card 22.

On the other hand, the first outside main surface 211 of the first pin electronics card has the first outside water jacket 24 attached to it, while the second outside main surface 221 of the second pin electronics card has the second outside water jacket 25 attached to it.

The intermediate water jacket 23, as shown in FIG. 6, is in close contact with the first inside main surface 212 of the first pin electronics card 21 and is in close contact with the second inside main surface 222 of the second pin electronics card 22. It has a passage 231 for circulation of the coolant between the first inside main surface 212 and the second inside main surface 222.

This passage 231 opens toward the first inside main surface 212 of the first pin electronics card 21 and opens toward the second inside main surface 222 of the second pin electronics card 22. Further, the first test-use devices 214 which are mounted on the first inside main surface 212 are housed in the passage 231, while the second test-use devices 224 which are mounted on the second inside main surface 222 are also housed in the same passage 231.

FIG. 7 shows one example of the overall configuration of the intermediate water jacket 23. As shown in the figure, recesses 234 are formed around the openings of the passages 231 of the intermediate water jacket 23. As shown in FIG. 6, seal members 235 are inserted into these recesses 234. Due to the seal members 235, the space between the intermediate water jacket 23 and the first and second inside main surfaces 212, 222 is sealed whereby leakage of coolant which runs through the inside of the passage 231 is prevented. As a specific example of the seal member 235, for example, a gasket which is composed of a material, such as rubber, which has the elasticity and is superior in sealing ability and which has a circular shape or X-shape cross-section may be mentioned.

Note that, the shapes and arrangements of the channels 231 in the intermediate water jacket 23 which is shown in FIG. 7 are just one example. The shapes and arrangements of the channels 231 in the water jackets 23 to 25 are set in accordance with the positions, arrangements, heat generation, etc. of the test-use devices 213, 214, 223, 224 which are mounted on the first and second pin electronics cards 21, 22.

Note that, as shown in FIG. 8, in the intermediate water jacket 23B, the first passage 236 which accommodates the first test-use devices 214 of the first pin electronics card 21 and the second passage 237 which accommodates the second test-use devices 224 of the second pin electronics card 22 may also be formed mutually independently.

On the other hand, the first outside water jacket 24 is also, as shown in FIG. 6, in close contact with the first outside main surface 211 of the first pin electronics card 21 and has a passage 241 for circulation of coolant along the first outside main surface 211.

This passage 241 opens toward the first outside main surface 211 of the first pin electronics card 21. The first test-use devices 213 of the first outside main surface 211 are housed in this passage 241.

As shown in FIG. 6, a seal member 245 is inserted in the recess formed around the opening of the passage 241 of the first outside water jacket 24. Due to this seal member 245, the clearance between the first water jacket 24 and the first outside main surface 211 is sealed and leakage of the coolant which circulates through the passage 241 is prevented. As a specific example of the seal member 245, a gasket etc. similar to the above-mentioned seal member 235 may be mentioned.

Similarly, the second outside water jacket 25 is also, as shown in FIG. 6, in close contact with the second outside main surface 221 of the second pin electronics card 22 and has a passage 251 for circulation of coolant along the second outside main surface 221.

This passage 251 opens toward the second outside main surface 221 of the second pin electronics card 22. The second test-use devices 223 of the second outside main surface 221 are housed in this passage 251.

As shown in FIG. 6, a seal member 255 is inserted in the recess formed around the opening of the passage 251 of the second outside water jacket 25. Due to this seal member 255, the clearance between the second water jacket 25 and the second outside main surface 221 is sealed and leakage of the coolant which circulates through the passage 251 is prevented. As a specific example of the seal member 255, a gasket etc. similar to the above-mentioned seal member 235 may be mentioned.

As shown in FIG. 6, the first pin electronics card 21 and first outside water jacket 24 are formed with through holes 216, 246 coaxially. Further, at the top surface of the intermediate water jacket 40, female threads 238 are formed corresponding to the through holes 216, 246. The first pin electronics card 21 and first outside water jacket 24 are fastened to the intermediate water jacket 23 by first bolts 247 which are inserted through the through holes 216, 246 being screwed into the female threads 238.

In the same way, the second pin electronics card 22 and the second outside water jacket 25 are formed with through holes 226, 256 coaxially. Further, at the bottom surface of the intermediate water jacket 23, female threads 239 are formed corresponding to the through holes 226, 256. The second pin electronics card 22 and second outside water jacket 25 are fastened to the intermediate water jacket 23 by second bolts 257 which are inserted through the through holes 226, 256 being screwed into the female threads 239.

In this way, in the present embodiment, by fastening the water jackets 23 to 25 to the pin electronics cards 21, 22 by the bolts 247, 257 from the two sides, the seal members 245, 255 can be sufficiently crushed and a sufficient sealing property can be secured.

As opposed to this, when fastening three water jackets and two pin electronics cards by a single bolt, it is not possible to sufficiently crush the seal member unless increasing the bolt diameter or increasing the engagement length.

Further, in the present embodiment, as shown in FIG. 6 and FIG. 7, the bolts 247, 257 are mutually offset in the plan view (A-direction arrow view in FIG. 6 and FIG. 7). For this reason, in the present embodiment, the engagement lengths of the bolts 247, 257 and the intermediate water jacket 23 can be sufficiently secured.

As shown in FIG. 2 and FIG. 3, the first outside water jacket 24 has an inlet side conduit 248 which is connected to a chiller 40 connected to it. Similarly, the second outside water jacket 25 has an outlet side conduit 258 which is connected to the chiller 40 connected to it. The chiller 40, for example, has a heat exchanger for cooling the coolant or a pump for circulating the coolant. Further, while not particularly shown, the base members 215, 225 of the first and second pin electronics cards 21, 22 are formed with communicating holes for passing the coolant and making it move between the water jackets 23 to 25.

For example, in the present embodiment, coolant which is supplied from the chiller 40 first enters the inside of the passage 241 of the first outside water jacket 24 through the inlet side conduit 248 and cools the first test-use devices 213 on the first outside main surface 211 of the first pin electronics card 21.

Next, the coolant enters the inside of the passage 231 of the intermediate water jacket 23 through the communicating hole of the first base member 215 and cools the test-use devices 214, 224 on the inside main surfaces 211, 221 of the pin electronics cards 21, 22.

Next, the coolant enters the passage 251 of the second outside water jacket 25 through the communicating hole of the second base member 225 and cools the second test-use devices 223 on the second outside main surface 221 of the second pin electronics card 22.

Further, after passing all of the devices, the coolant is recovered through the outlet side conduit 258 at the chiller 40, is again cooled, then is supplied to the inlet side conduit 248.

As the coolant which circulates through the insides of the water jackets 23 to 25, a fluorine-based inert liquid (for example, Fluorinert® made by 3M) or other liquids which are superior in electrical insulating property may be mentioned. Note that, the path of the coolant in the water jackets 23 to 25 is not particularly limited to the above.

Further, as shown in FIG. 9 and FIG. 10, the first connectors 217 are mounted on the top part of the first pin electronics card 20 at substantially equal intervals. The first connectors 217 are fastened to the first inside main surface 212 of the first pin electronics card 21, while the engagement parts 218 with the connectors 105 on the mother board 104 side (see FIG. 4) face along the planar direction of the first pin electronics card 21.

In the same way, as shown in FIG. 10 to FIG. 12, the second connectors 227 are mounted on the top part of the second pin electronics card 22 at substantially equal intervals. The second connectors 227 are fastened to the second inside main surface 222 of the second pin electronics card 22, while the engagement parts 228 with the connectors 106 of the mother board 104 side (see FIG. 4) face along the planar direction of the second pin electronics card 22.

In this way, in the present embodiment, by mounting the connectors 217, 227 on the inside main surfaces 212, 222 of the pin electronics cards 21, 22, it is possible to eliminate the effects of variations in thickness of the base members 215, 225 with respect to engagement of the connectors 217, 227.

Note that, when superposing two pin electronics cards 21, 22 via an intermediate water jacket 23, to prevent the connectors 217, 227 from interfering with each other, as shown in FIG. 10 and FIG. 12, the first connectors 217 and the second connectors 227 are arranged to be mutually offset in a plan view.

Further, in the present embodiment, as shown in FIG. 4 and FIG. 10 to FIG. 13, a spacer 26 is interposed between the first pin electronics card 21 and second pin electronics card 22. This spacer 26 is arranged on the top part of the pin electronics cards 21, 22 and is fastened by bolts 261 to the pin electronics cards 21, 22.

Guide pins 262 which stick out toward the engagement direction of the first and second connectors 217, 227 are provided at the two ends of this spacer 26. The guide pins 262 can be inserted into guide holes 107 which are provided at the mother board 104 side (see FIG. 4). By the guide pins 262 being inserted into the guide holes 107, the first and second connectors 217, 227 of the pin electronics cards 21, 22 are positioned with respect to the connectors 105, 106 of the mother board 104.

Here, if the two pin electronics cards 21, 22 are independently provided with guide pins, sometimes variations in positions of the guide pins in the thickness direction (Z-direction in FIG. 13) end up being reflected in the fit of the connectors 217, 227.

As opposed to this, in the present embodiment, by having two pin electronics cards 21, 22 share a single guide pin 262, the effects of variations in the position of the guide pin 262 with respect to the fit of the connectors 217, 227 is suppressed.

Further, as shown in FIG. 13, a single guide shaft 263 passes through this spacer 262 and the two pin electronics cards 21, 22. This guide shaft 263 is used to position the two pin electronics cards 21, 22 with each other in the plan direction (XY direction in FIG. 13). For this reason, in the present embodiment, the effects of positional deviation between the pin electronics cards 21, 22 with respect to fit of the connectors 217, 227 are suppressed.

As explained above, in the present embodiment, by sandwiching a single water jacket 23 between the first pin electronics card 21 and second pin electronics card 22, the two pin electronics cards 21, 22 share a single water jacket 23. For this reason, the test module 20 becomes thinner and the test head 10 becomes smaller in the thickness direction of the test modules 20, so the electronic device test apparatus 1 can be made smaller in size. Further, in a test head of the same size, the density of the test modules 20 inside of the test head can be raised.

Further, in the present embodiment, the two surfaces of the intermediate water jacket 23 have passages 231 opened in them, so it is possible to have two pin electronics cards 21, 22 share a single water jacket 23.

The test module 20 in the present embodiment corresponds to one example of the board assembly in the present invention, the first pin electronics card 21 in the present embodiment corresponds to one example of the first board of the present invention, the second pin electronics card 22 in the present embodiment corresponds to one example of the second board of the present invention, the first test-use device 214 in the present embodiment corresponds to one example of the first electronic device in the present invention, the second test-use device 223 in the present embodiment corresponds to one example of the second electronic device in the present invention, and the passage 231 in the present embodiment corresponds to one example of the first passage and second passage in the present invention.

Note that the embodiments explained above were described for facilitating understanding of the present invention and were not described for limiting the present invention. Therefore, the elements disclosed in the above embodiments include all design modifications and equivalents falling under the technical scope of the present invention.

REFERENCE SIGNS LIST

1 . . . electronic device test apparatus
10 . . . test head
20 . . . test modules
21 . . . first pin electronics card
211 . . . first outside main surface
212 . . . first inside main surface
213, 214 . . . first test-use devices
215 . . . first base member
217 . . . first connector
22 . . . second pin electronics card
221 . . . second outside main surface
222 . . . second inside main surface
223, 224 . . . second test-use devices
225 . . . base member
227 . . . second connector
23, 23B . . . intermediate water jacket
231 . . . passage
24 . . . first outside water jacket
241 . . . channel
247 . . . first bolt
25 . . . second outside water jacket
251 . . . channel
257 . . . second bolt
26 . . . spacer
262 . . . guide pin
30 . . . control device
40 . . . chiller
50 . . . handler

The invention claimed is:

1. A board assembly comprising:
a first board;
a second board; and
one intermediate water jacket which is sandwiched between the first board and the second board, wherein
the intermediate water jacket
is in close contact with a first inside main surface of the first board which faces the second board and
is in close contact with a second inside main surface of the second board which faces the first board,
the assembly comprises:
a first outside water jacket which is attached to a first outside main surface of the first board at an opposite side to the first inside main surface; and
a second outside water jacket which is attached to a second outside main surface of the second board at an opposite side to the second inside main surface,
the first outside water jacket and the first board are fastened by a first bolt to the intermediate water jacket, and
the second outside water jacket and the second board are fastened by a second bolt to the intermediate water jacket.

2. The board assembly as set forth in claim 1, wherein
the first board has a first connector which is mounted on the first inside main surface, and
the second board has a second connector which is mounted on the second inside main surface.

3. The board assembly as set forth in claim 2, wherein, in a plan view, the first connector and the second connector are arranged to be mutually offset.

4. The board assembly as set forth in claim 2, wherein
the assembly comprises a spacer which is interposed between the first board and the second board, and
the spacer has a guide pin which sticks out toward the engagement direction of the first and the second connectors.

5. The board assembly as set forth in claim 1, wherein, in a plan view, the first bolt and the second bolt are arranged to be mutually offset.

6. An electronic device test apparatus for testing a device under test, the electronic device test apparatus comprising a test head inside of which the board assembly as set forth in claim 1 is housed.

7. A board assembly comprising:
a first board;
a second board; and
an intermediate water jacket which is sandwiched between the first board and the second board, wherein
the first board has at least one first electronic device which is mounted on a first inside main surface of the first board which faces the second board,
the second board has at least one second electronic device which is mounted on a second inside main surface of the second board which faces the first board,
the intermediate water jacket has:
a first passage through which a coolant can run and opens toward the first inside main surface; and
a second passage through which a coolant can run and opens toward the second inside main surface,
the first electronic device is housed in the first passage,
the second electronic device is housed in the second passage,
the assembly comprises:
a first outside water jacket which is attached to a first outside main surface of the first board at an opposite side to the first inside main surface; and
a second outside water jacket which is attached to a second outside main surface of the second board at an opposite side to the second inside main surface,
the first outside water jacket and the first board are fastened by a first bolt to the intermediate water jacket, and
the second outside water jacket and the second board are fastened by a second bolt to the intermediate water jacket.

8. The board assembly as set forth in claim 7, wherein the first passage and the second passage are the same passage.

9. The board assembly as set forth in claim 7, wherein the first passage and the second passage are mutually independent.

10. The board assembly as set forth in claim 1, wherein
the first board has a first connector which is mounted on the first inside main surface, and
the second board has a second connector which is mounted on the second inside main surface.

11. The board assembly as set forth in claim 10, wherein, in a plan view, the first connector and the second connector are arranged to be mutually offset.

12. The board assembly as set forth in claim 10, wherein
the assembly comprises a spacer which is interposed between the first board and the second board, and
the spacer has a guide pin which sticks out toward the engagement direction of the first and the second connectors.

13. The board assembly as set forth in claim 7, wherein, in a plan view, the first bolt and the second bolt are arranged to be mutually offset.

14. An electronic device test apparatus for testing a device under test, the electronic device test apparatus comprising a test head inside of which the board assembly as set forth in claim 7 is housed.

* * * * *